(12) United States Patent
Yamashita (10) Patent No.: US 9,473,024 B2
(45) Date of Patent: Oct. 18, 2016

(54) SEMICONDUCTOR INTEGRATED CIRCUIT POWER SUPPLY CONTROL DEVICE

(71) Applicant: Kabushiki Kaisha Toshiba, Minato-ku (JP)

(72) Inventor: Takahiro Yamashita, Sumida-ku (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 275 days.

(21) Appl. No.: 14/272,069

(22) Filed: May 7, 2014

(65) Prior Publication Data

US 2014/0239926 A1 Aug. 28, 2014

Related U.S. Application Data

(63) Continuation of application No. PCT/JP2012/058028, filed on Mar. 19, 2012.

(30) Foreign Application Priority Data

Nov. 9, 2011 (JP) .................................. 2011-245830

(51) Int. Cl.
*G05F 1/56* (2006.01)
*H02M 3/156* (2006.01)
(Continued)

(52) U.S. Cl.
CPC ........ *H02M 3/1563* (2013.01); *H01L 27/0207* (2013.01); *H01L 27/088* (2013.01)

(58) Field of Classification Search
CPC .................................................. H02M 3/1563
USPC ......................................... 323/271–289, 351
See application file for complete search history.

(56) References Cited

U.S. PATENT DOCUMENTS 5,838,186 A 11/1998 Inoue et al.
6,617,896 B2 9/2003 Uenishi et al.
(Continued)

FOREIGN PATENT DOCUMENTS

JP 08-097701 A 4/1996
JP 2002-189059 A 7/2002
(Continued)

OTHER PUBLICATIONS

International Search Report mailed Apr. 24, 2012 for PCT/JP2012/058028 filed on Mar. 19, 2012 in English.
(Continued)

*Primary Examiner* — Adolf Berhane
*Assistant Examiner* — Nusrat Quddus
(74) *Attorney, Agent, or Firm* — Oblon, McClelland, Maier & Neustadt, L.L.P (57) ABSTRACT

A semiconductor integrated circuit device according to an embodiment includes at least one first transistor connected at its source to an input power supply line, connected at its drain to an output power supply line, and connected at its gate to a first control line, at least one second transistor connected at its source to the input power supply line, connected at its drain to the output power supply line, and connected at its gate to a second control line, a first buffer which drives the first control line, a second buffer configured to receive a control signal input via the first control line and drive the second control line, and a plurality of transfer gates provided to divide the first control line into a plurality of pieces, the plurality of transfer gates being capable of connecting pieces obtained by dividing the first control line.

15 Claims, 8 Drawing Sheets

(51) Int. Cl.
*H01L 27/02* (2006.01)
*H01L 27/088* (2006.01)

(56) References Cited

U.S. PATENT DOCUMENTS

| | | | | |
|---|---|---|---|---|
| 6,809,970 | B2* | 10/2004 | Mazumder | G11C 5/147 365/189.02 |
| 6,968,486 | B2 | 11/2005 | Matsushima | |
| 7,514,963 | B2 | 4/2009 | Nishikawa | |
| 7,558,556 | B1* | 7/2009 | Moloudi | H04B 1/40 323/267 |
| 7,956,677 | B2 | 6/2011 | Igarashi et al. | |
| 7,969,237 | B2 | 6/2011 | Fujita et al. | |
| 2003/0179031 | A1* | 9/2003 | Arima | H03K 3/0375 327/218 |
| 2004/0095110 | A1* | 5/2004 | Kernahan | H02M 3/157 323/282 |
| 2014/0239926 | A1* | 8/2014 | Yamashita | H02M 3/1563 323/271 |

FOREIGN PATENT DOCUMENTS

| | | |
|---|---|---|
| JP | 2002-368602 A | 12/2002 |
| JP | 2004-229193 A | 8/2004 |
| JP | 2005-012717 A | 1/2005 |
| JP | 2008-034667 A | 2/2008 |
| JP | 2008-177193 A | 7/2008 |
| JP | 2008-300765 A | 12/2008 |
| JP | 2009-170651 A | 7/2009 |
| JP | 2010-245403 A | 10/2010 |
| JP | 2010-258267 A | 11/2010 |
| JP | 2011-199094 A | 10/2011 |

OTHER PUBLICATIONS

Kazuki Fukuoka, et al., "A 1.92μs-wake-up time thick-gate-oxide power switch technique for ultra low-power single-chip mobile processors", VLSI 2007 (Dec. 2004), pp. 128-129.

* cited by examiner

SEMICONDUCTOR INTEGRATED CIRCUIT POWER SUPPLY CONTROL DEVICE

CROSS REFERENCE TO RELATED APPLICATIONS

This application is a continuation of International Application No. PCT/JP2012/058028, filed on Mar. 19, 2012, which is based upon and claims the benefit of priority from the prior Japanese Patent Application No. 2011-245830, filed on Nov. 9, 2011, the entire contents of which are incorporated herein by reference.

FIELD

Embodiments described herein relate generally to a semiconductor integrated circuit device.

BACKGROUND

In the conventional field of the semiconductor integrated circuit device, it is known to insert a switch transistor (hereafter referred to as SWTR as well) into a power supply line or a ground line to partially interrupt the power supply. In a circuit having the SWTR inserted therein, a large rush current might be generated to charge a capacitance of a power supply line which has been intercepted when the circuit is returned from a power supply interception state to an operation state. There is a fear that the generated large rush current might produce power supply noise and the noise might exert bad influence upon other circuits in operation.

As a first method for solving this problem, it is proposed to suppress the rush current by dividing the power supply switch into switches and turning on them successively. A delay time for successively turning on power supply switches obtained by the division is controlled by providing capacitors between a power supply within the semiconductor integrated circuit device (hereafter referred to as virtual power supply as well) and control lines for controlling the power supply switches obtained by the division.

DETAILED DESCRIPTION

A semiconductor integrated circuit device according to an embodiment includes: at least one first transistor connected at a source thereof to an input power supply line, connected at a drain thereof to an output power supply line, and connected at a gate thereof to a first control line; at least one second transistor connected at a source thereof to the input power supply line, connected at a drain thereof to the output power supply line, and connected at a gate thereof to a second control line; a first buffer configured to drive the first control line; a second buffer configured to receive a control signal input via the first control line and drive the second control line; and a plurality of transfer gates provided to divide the first control line into a plurality of pieces, the plurality of transfer gates being capable of connecting pieces obtained by dividing the first control line.

Hereafter, embodiments will be described with reference to the drawings.

First Embodiment

Figure 1:
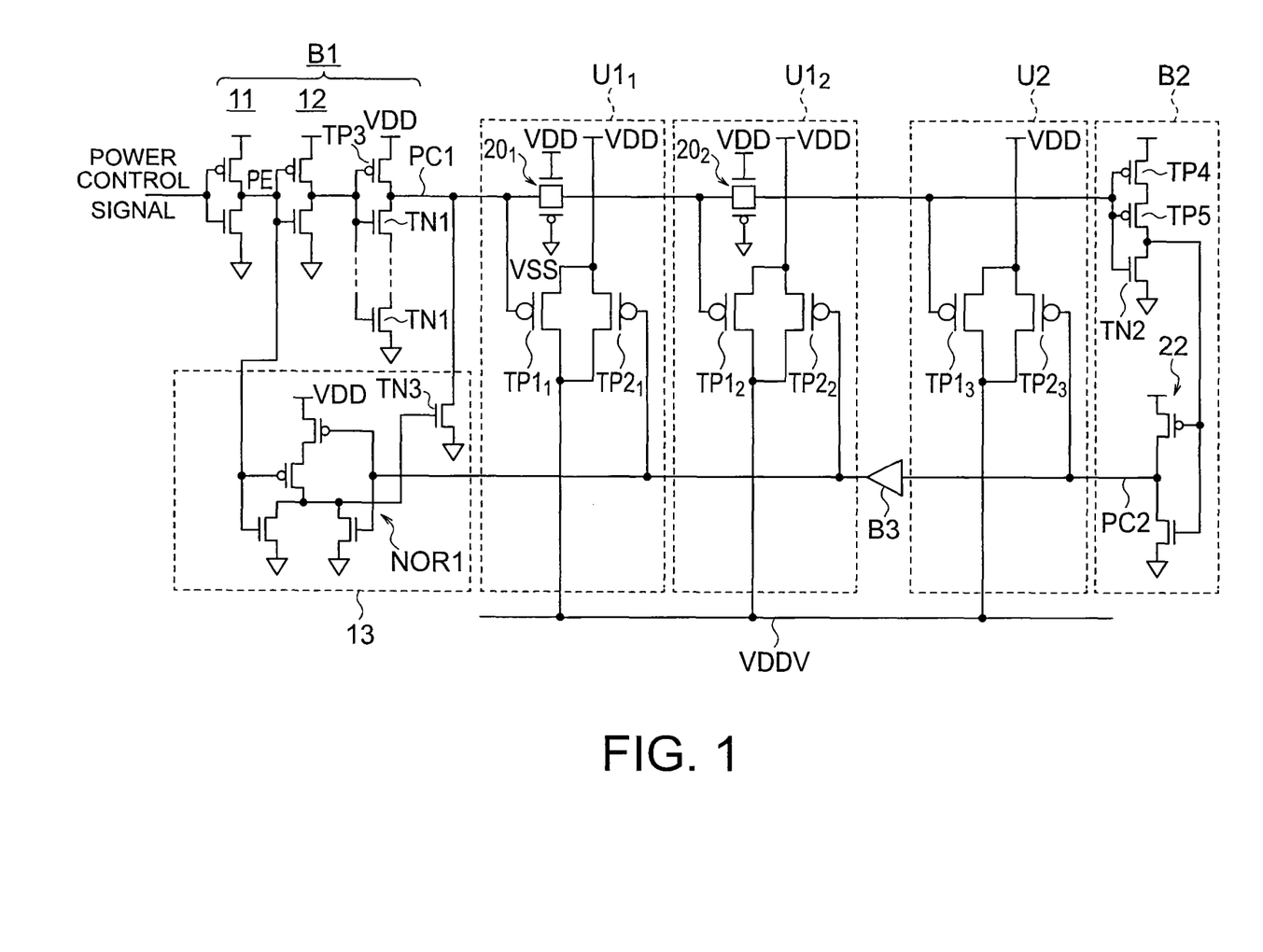
FIG. 1 is a circuit diagram showing a semiconductor integrated circuit device according to a first embodiment.

A semiconductor integrated circuit device according to a first embodiment is shown in FIG. 1. The semiconductor integrated circuit device according to the first embodiment is a power supply control device, and a power supply voltage from a power supply provided externally to the semiconductor integrated circuit device is supplied to the semiconductor integrated circuit device via a power supply line VDD serving as an input power supply line. A virtual power supply line VDDV is provided within the semiconductor integrated circuit device to supply a power supply voltage to an internal logic circuit (not illustrated). The logic circuit which is not illustrated is connected to the virtual power supply line VDDV serving as an output power supply line.

1. General Configuration

The semiconductor integrated circuit device according to the first embodiment includes buffers B1 to B3, a plurality of power supply switch units U1, a plurality of power supply switch units U2, and a drive circuit 13. The power supply switch unit U1 includes two pMOS transistors TP1 and TP2, and a transfer gate 20. The plurality of power supply switch units U1 have a similar configuration. The plurality of power supply switch units U1 are provided between the power supply line VDD and the virtual power supply line VDDV.

1.1 Power Supply Switch Unit U1

A case where two power supply switch units $U1_1$ and $U1_2$ are provided as shown in FIG. 1 will be described as an example. In the power supply switch unit $U1_1$, a pMOS transistor $TP1_1$ is connected at a first terminal of its current path to the power supply line VDD, connected at a second terminal of its current path to the virtual power supply line VDDV, and connected at its gate to a control line PC1.

A pMOS transistor $TP2_1$ is connected at a first terminal of its current path to the power supply line VDD in common to the first terminal of the current path of the transistor $TP1_1$, connected at a second terminal of its current path to an output terminal of the virtual power supply line VDDV, and connected at its gate to an output terminal of the buffer B3.

A transfer gate $20_1$ includes an nMOS transistor connected at its gate to the power supply line VDD and a pMOS transistor connected at its gate to a ground power supply line VSS. The transfer gate $20_1$ is connected at a first terminal of its current path to the control line PC1 and connected at a second terminal of its current path to a first terminal of a current path of a transfer gate $20_2$.

In the same way, in the power supply switch unit $U1_2$, a pMOS transistor $TP1_2$ is connected at a first terminal of its current path to the power supply line VDD, connected at a second terminal of its current path to the virtual power supply line VDDV, and connected at its gate to the second terminal of the current path of the transfer gate $20_1$.

A pMOS transistor $TP2_2$ is connected at a first terminal of its current path to the power supply line VDD in common to the first terminal of the current path of the transistor $TP1_2$, connected at a second terminal of its current path to the output terminal of the virtual power supply line VDDV, and connected at its gate to an output terminal of the buffer B3.

A transfer gate $20_2$ includes an nMOS transistor connected at its gate to the power supply line VDD and a pMOS transistor connected at its gate to the ground power supply line VSS. The transfer gate $20_2$ is connected at a first terminal of its current path to the second terminal of the current path of the transfer gate $20_1$ and connected at a second terminal of its current path to the power supply switch unit U2.

The transfer gates $20_1$ and $20_2$ have a function of dividing the control line PC1 into a plurality of lines. Since gates of nMOS transistors included in the transfer gates $20_1$ and $20_2$ are the power supply line VDD and gates of pMOS are the ground power supply line VSS, the transfer gates $20_1$ and $20_2$ are always in the on-state. It is possible to increase resistance components and obtain sufficient RC delays by providing the plurality of transfer gates $20_1$ and $20_2$.

Furthermore, a first control signal is input to the gates of the pMOS transistors $TP1_1$ and $TP1_2$ respectively in the power supply switch units U1. The pMOS transistors $TP1_1$ and $TP1_2$ are controlled to turn on or off on the basis of the first control signal.

In the present embodiment, the case where the two power supply switch units $UI_1$ and $UI_2$ are provided has been described. However, the embodiment is not restricted to the case. For example, in the case where a greater RC delay is needed, more than two power supply switch units UI are provided. When providing n power supply switch units $UI_1$ to $UI_n$ (where n is greater than 2), these power supply switch units $UI_1$ to $UI_n$ are disposed consecutively as close to the buffer B1 as possible. If the power supply switch units $UI_1$ to $UI_n$ are disposed in positions far from the buffer B1, capacitance of a parasitic capacitor which exists beyond the transfer gates $20_1$ to $20_n$ is small and consequently the delay time cannot be prolonged so much.

1.2 Power Supply Switch Unit U2

The power supply switch unit U2 has a configuration similar to that of the power supply switch unit U1. A pMOS transistor $TP1_3$ in the power supply switch unit U2 is connected at its gate to the second terminal of the current path of the transfer gate $20_2$. A pMOS transistor $TP2_3$ in the power supply switch unit U2 is connected at its gate to an input terminal of the buffer B3. Other connection relations are similar to those of the power supply switch unit U1, and details thereof will be omitted.

In the ensuing description, the power supply switches and $U1_2$ are simply referred to as U1, the pMOS transistors $TP1_1$, $TP1_2$ and $TP1_3$ are simply referred to as TP1, and the pMOS transistors $TP2_1$, $TP2_2$ and $TP2_3$ are simply referred to as TP2.

1.3 Buffers B1 to B3 and Drive Circuit 13

The control line PC1 is connected to an input terminal of the buffer B2, and an output terminal of the buffer B2 is connected to a control line PC2. The buffer B2 is configured to output a second control signal which is inverted in output onto the control line PC2 when the first control signal supplied via the control line PC1 has exceeded a threshold. The buffer B2 includes pMOS transistors TP4 and TP5 connected in cascade, an nMOS transistor TN2, and an inverter 22. The transistor TP2 is connected at its gate to the control line PC2 and configured to be controlled in conduction of a path between its drain and source by the second control signal supplied via the control line PC2. It is necessary for the buffer B2 which generates the second control signal to invert the second control signal with comparative sharpness and turn the transistor TP2 on completely. Therefore, the buffer B3 is added into the control line PC2 in order to prevent the buffer B2 in drive power for turning on each transistor TP2 from becoming insufficient.

A time constant of transition of the first control signal, i.e., a time constant based upon a capacitance component and a resistance component connected to the control line PC1 can be made great in value as on-resistance connected to the control line PC1 is made great. Depending upon a leak current at the gate of the transistor TP1, however, an on-resistance having a comparatively large resistance value is connected to the control line PC1. As a result, it is considered that the first control signal does not fall to a reference potential and the transistor TP1 does not turn on completely even after the transistor TP2 turns on.

If the first control signal does not arrive at the reference potential due to influence of the leak current at the gate of the transistor TP1 and the on-resistance, it is also conceivable that a through current will flow through the buffer B2 resulting in an increased power consumption quantity.

Therefore, the present embodiment has a configuration obtained by adding a drive circuit 13 to turn the transistor TP1 on completely after the transistor TP2 has turned on.

The drive circuit 13 includes an NMOS transistor TN3 and a NOR circuit NOR1. The NOR circuit NOR1 is supplied with the second control signal from the control line PC2 as well as an inverted signal PE from an inverter 11. The NOR circuit NOR1 performs a NOR operation on the second control signal and the inverted signal PE, and supplies a result of the operation to a gate of the transistor TN3. The transistor TN3 is connected at its drain to the control line PC1, and connected at its source to the ground power supply line VSS. As a result of an output of the NOR circuit NOR1 becoming an H level, the transistor TN3 turns on. As a result, drive force on the first control signal is intensified to cause a transition of the first control signal to an L level completely.

Furthermore, a transistor size of the transistor TP2 is set to be greater than a transistor size of the transistor TP1. In the stationary state, therefore, sufficient power is supplied to the virtual power supply line VDDV by the transistor TP2. In addition, when power supply to the virtual power supply line VDDV is started, the power supply voltage gradually rises while suppressing the rush current by the transistor TP1.

The first control signal supplied to the control line PC1 is given by the buffer B1. The buffer B1 is formed of inverters 11 and 12, a pMOS transistor TP3, and a plurality of NMOS transistors TN1. A power control signal for controlling power supply to a logic circuit which is not illustrated is supplied to the inverter 11. The inverter 11 outputs the inverted signal PE obtained by inverting the power control signal to an inverter 12. The inverter 12 inverts the inverted signal PE and outputs a resultant signal.

A drain-source path of the transistor TP3 and drain-source paths of the plurality of transistors TN1 are connected in series between the power supply line VDD and a reference potential point. An on-resistance unit VR is formed of the plurality of transistors TN1. The control line PC1 is connected to a connection node between drains of the transistor TP3 and one of the transistors TN1. A power control signal from the inverter 12 is applied to gates of the transistor TP3 and the transistors TN1.

Figure 2:
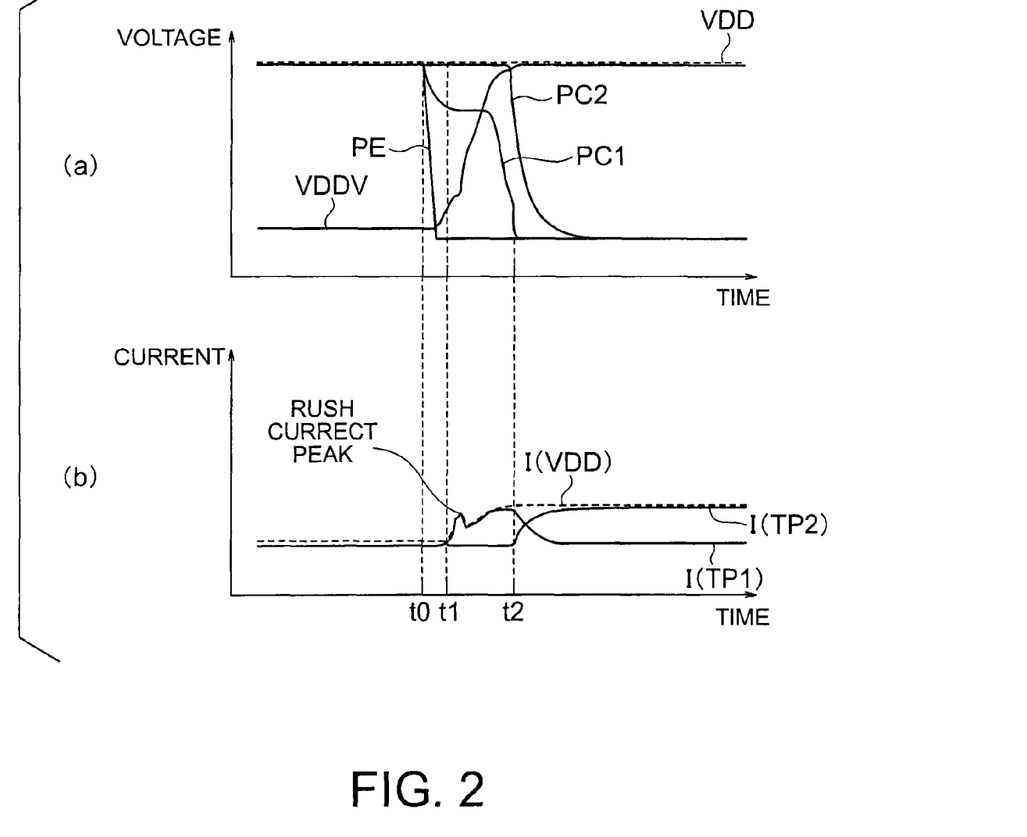
FIG. 2 is a diagram for explaining operation of the semiconductor integrated circuit device according to the first embodiment.

Operation of the embodiment having such a configuration will now be described with reference to FIGS. 2(a) and 2(b). FIGS. 2(a) and 2(b) are waveform diagrams for explaining the operation of the first embodiment with the abscissa axis indicating time and the ordinate axis indicating a voltage or a current. In FIG. 2(a), VDD indicates a voltage on the power supply line VDD, VDDV indicates a voltage on the virtual power supply line VDDV, PE indicates a voltage of the inverted signal, PC1 indicates a voltage of the first control signal, and PC2 indicates a voltage of the second control signal. In FIG. 2(b), I(VDD) indicates a current on the power supply line VDD, I(TP1) indicates a drain current of the transistor TP1, and I(TP2) indicates a drain current of the transistor TP2.

It is now supposed that the logic circuit which is controlled in power supply by the power supply control device in the first embodiment shown in FIG. 1 is in a standby state. In this state, the power control signal is at a low level (hereafter referred to as L level). The inverted signal PE supplied from the inverter 11 is at a high level (hereafter referred to as H level), and the power control signal supplied from the inverter 12 is at the L level.

The output of the inverter 12 is supplied to the gates of the transistors TP3 and TN1, and the transistor TP3 is in the on-state and the transistors TN1 are in the off-state. Therefore, both the first control signal appearing on the control line PC1 and the second control signal appearing on the control line PC2 are at the H level. Therefore, the transistors TP1 and TP2 are in the off-state, and the power supply switches U1 and U2 are intercepted in conduction. As a result, power from the power supply line VDD is not supplied to the virtual power supply line VDDV.

It is now supposed that the power control signal changes from the L level to the H level in order to activate the logic circuit. As shown in FIG. 2(a), the inverted signal PE changes from the H level to the L level with comparative steepness at timing of time t0. As a result, the transistor TP3 included in the buffer B1 turns off and the transistors TN1 included in the buffer B1 turn on. Accordingly, the first control signal on the control line PC1 makes a transition from the H level to the L level.

The first control signal changes with a time constant (time constant of a transition of the first control signal) based upon a capacitance component and a resistance component connected to the control line PC1. As the capacitance component connected to the control line PC1, there are gate capacitances of the plurality of transistors TP1. As the resistance component connected to the control line PC1, there are on-resistances of the transfer gates 20 and an on-resistance of the on-resistance unit VR formed of the plurality of transistors TN1. In other words, the first control signal makes a transition from the H level to the L level in accordance with the time constant of the transition of the first control signal which depends upon the gate capacitances of the plurality of transistors TP1, the on-resistances of the transfer gates 20, and the on-resistances of the plurality of transistors TN1.

If the first control signal changes from the H level to the L level as indicated by a time period (t0-t1) in FIG. 2(a), then the transistors TP1 gradually turn on, currents begin to flow from the power supply line VDD to the virtual power supply line VDDV, and the voltage on the virtual power supply line VDDV begins to rise. In the present embodiment, the time constant of the transition of the first control signal is set suitably, and the level of the first control signal changes with comparative slowness.

The first control signal is supplied to the control line PC2 via the buffer B2. The buffer B2 inverts its output when its input exceeds the threshold. At a stage of the time t1, therefore, the buffer B2 maintains its H level output. Over this time period, therefore, the transistors TP2 are in the off-state.

The voltage on the virtual power supply line VDDV gradually rises. If the time t1 is reached, then the voltage drop of the first control signal on the control line PC1 is suppressed by the gate capacitance of the power supply switch unit U1. As a result, the level change from the H level to the L level of the first control signal is suppressed.

In this way, the level of the first control signal changes little over a predetermined time period which continues for some time from the time t1. Therefore, the transistors TP1 connected to the control line PC1 are not brought into a complete on-state, but are kept in a slightly conducted state. In other words, the current flowing from the power supply line VDD to the virtual power supply line VDDV is small. As indicated by I(TP1) and I(VDD) in FIG. 2(b), therefore, the rush current is suppressed sufficiently.

The voltage on the virtual power supply line VDDV rises gently. At a time which is a little before, the voltage on the virtual power supply line VDDV approaches the voltage on the power supply line VDD and the voltage change on the virtual power supply line VDDV becomes remarkably slight. At this timing, the level of the first control signal on the control line PC1 begins to fall again in accordance with the time constant of the transition of the first control signal.

At timing which is nearly close to the time t2 when the level of the first control signal falls sufficiently, the transistors TP1 turn on nearly completely. Furthermore, since the level of the first control signal exceeds the threshold, the buffer B2 turns on. At timing of the time t2, the second control signal on the control line PC2 changes steeply from the H level to the L level. As a result, the transistors TP2 turn on. Furthermore, since the second control signal is supplied to the NOR circuit NOR1 as well, the inverted signal PE is at the L level after the time t0. As a result of the second control signal becoming the L level, the output of the NOR circuit NOR1 becomes the H level. As a result, the transistor TN3 turns on, and the control line PC1 is connected to the ground power supply line. Accordingly, the first control signal falls to the ground potential steeply.

As a result, the transistors TP1 are forcibly brought into the complete on-state. In other words, all transistors TP1 and TP2 are brought into the complete on-state, and currents flow from the power supply line VDD to the virtual power supply line VDDV via drain-source paths of the transistors TP1 and TP2. Accordingly, the voltage on the virtual power supply line VDDV nearly coincides with the voltage on the power supply line VDD. By the way, as shown in FIG. 2(b), the current I(TP2) flowing through the transistor TP2 is sufficiently greater than the current I(TP1) flowing through the transistor TP1 in the stationary state.

Effect of First Embodiment

In the present embodiment, the plurality of transfer gates 20 are provided respectively in association with power supply switch units U1 to divide the control line PC1 as described hereafter. As a result, it is possible to increase the resistance component and obtain a sufficient RC delay. Therefore, feedback control which suppresses the level change of the first control signal is exercised as the voltage on the virtual power supply line VDDV rises, by providing the plurality of transfer gates 20. Over a comparatively long time period during which the voltage on the virtual power supply line VDDV is rising, therefore, the gate potential of the transistor TP1 remains at an intermediate potential. As a result, the current flowing through the drain-source path of the transistor TP1 is suppressed, and the rush current generated when starting a power supply for the logic circuit connected to the virtual power supply line VDDV is suppressed.

Furthermore, since the level change of the first control signal is suppressed by the transfer gates 20, a sufficient delay time is generated between a rising edge of the voltage on the virtual power supply line VDDV and the turning on of the transistor TP2. Since the rising of the voltage on the virtual power supply line VDDV is completed by turning on of the transistor TP2, the voltage on the virtual power supply line VDDV rises slowly and the rush current is suppressed.

Furthermore, the gate voltage of the transistor TP1 remains at an intermediate voltage in the vicinity of the threshold of the transistor TP1 at which the voltage transition on the virtual power supply line VDDV begins, for a sufficient time. Even if the threshold varies due to variations in manufacture, therefore, the equivalent state of the on-current is maintained regardless of the variations. In the present embodiment, therefore, operation according to the design becomes possible regardless of the manufacturing variations of the components.

In this way, in the present embodiment, the power supply voltage change on the virtual power supply line is controlled to have a desired rate by using transistors of two kinds which differ in gate width, making it easy to raise the power supply voltage gently by means of transistors which are small in gate width, and suitably setting the number of the power supply switch units U1 and U2 to suitably set the time constant of the transition of the first control signal. In addition, generation of the rush current is prevented by providing parasitic capacitances between the control line and the virtual power supply line, thereby exercising feedback control on the first control signal to supply an intermediate potential to gates of the transistors which are small in gate width continuously over a comparatively long time, and thereby suppressing the flow of the drain currents.

Furthermore, upon nearly termination of the rise of the power supply voltage on the virtual power supply line, the falling of the first control signal is resumed, the second control signal is inverted, the transistors TP2 which are large in gate width turn on, and the power supply voltage on the virtual power supply line reaches the voltage on the power supply line. In the present embodiment, therefore, a circuit which detects rising of the power supply voltage is not needed and it is possible to supply the power supply voltage stably while suppressing the rush current with a simple configuration.

In addition, the semiconductor integrated circuit device according to the present embodiment can suppress an increase of the chip area. Hereafter, it will be described specifically in comparison with a comparative example.

Figure 7:
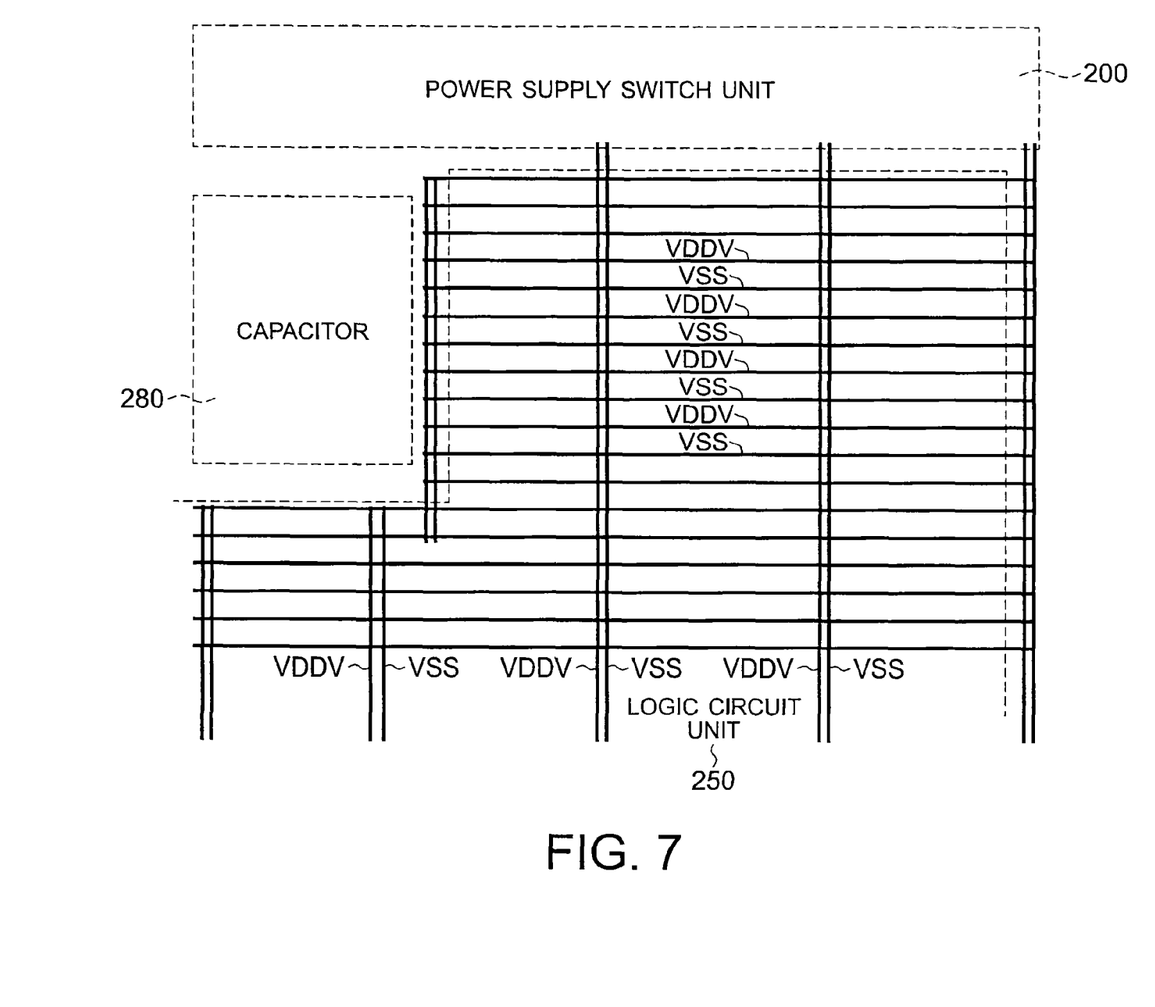
FIG. 7 is a diagram showing a layout of a semiconductor integrated circuit device according to a comparative example.

A layout of a semiconductor integrated circuit device according to the comparative example is shown in FIG. 7. The semiconductor integrated circuit device according to the comparative example includes a power supply switch unit 200, a logic circuit unit 250, and a capacitor 280. The power supply switch unit 200 includes a SWTR. A gate and a drain of the SWTR are connected to each other by the capacitor 280. By the way, the logic circuit unit is an area where a logic circuit is provided. In this comparative example, an area occupied by the capacitor is large and the area of the chip also increases.

Figure 8:
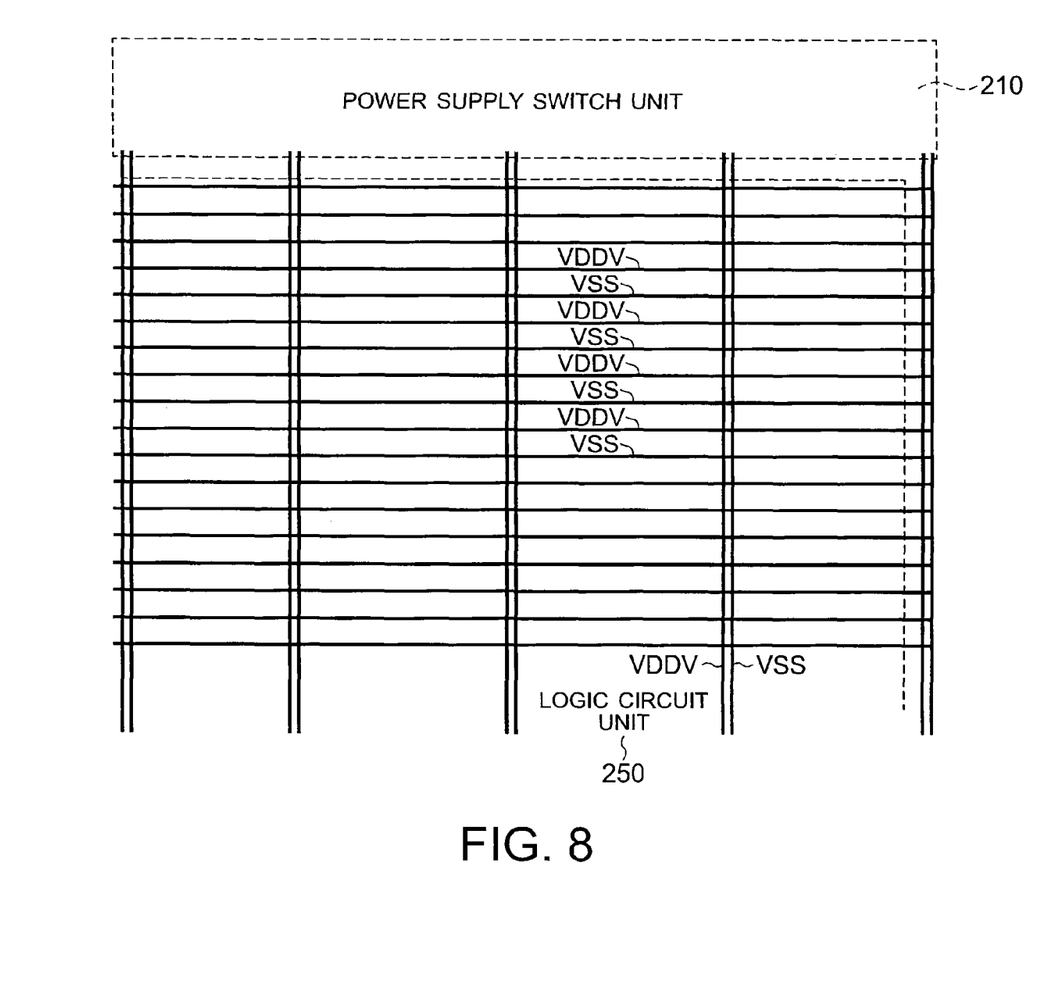
FIG. 8 is a diagram showing a layout of the semiconductor integrated circuit device according to the first embodiment.

On the other hand, a layout of the semiconductor integrated circuit device according to the present embodiment is shown in FIG. 8. In the present embodiment, it is not necessary to provide the capacitor 280 as appreciated from FIG. 8 and consequently the increase of the chip area can be suppressed. In FIG. 8, a power supply switch unit 210 includes the power supply switch units U1 and U2 shown in FIG. 1. In this way, it is not necessary to provide the capacitor in the present embodiment. As compared with the comparative example, therefore, an area which can be used as the logic circuit unit can be increased. In other words, if the area of the logic circuit unit is the same area, an external shape can be shrunk.

In the comparative example, it is necessary to provide the capacitor and consequently make the logic circuit unit small by that amount. Within the logic circuit unit, power supply lines such as the power supply lines VDDV and VSS are arranged longitudinally and laterally. To make the logic circuit unit small, therefore, it is necessary to cause power supply lines at an terminal of the logic circuit unit on the capacitor side to assume complicated interconnections in conformity with the disposition of the capacitor and its design needs contrivances. For example, 1) left sides of the power supply lines running laterally are cut away from the top to the height of the capacitor (where the height is the distance between the top and bottom of the capacitor in FIG. 7). 2) A power supply line is provided on a cut end face in the longitudinal direction. 3) A capacitor cell is disposed on the end face. 4) Power supply lines in the longitudinal direction in a part corresponding to the capacitor are cut away. 5) An area where standard cells are disposed (logic circuit unit) is set in the same way except the part cut away.

On the other hand, in the present embodiment, the layout can be simplified as shown in FIG. 8 and the circuit design can also be conducted easily.

(Modification)

In the first embodiment shown in FIG. 1, the gate width of the transistors TP1 and the transistors TP2 is changed alternately. When the power supply is raised, the transistors TP1 which are small in gate width are turned on to change the voltage gently. When rising of the power supply voltage is finished, the transistors TP2 which are large in gate width are turned on. Thereby, secure power supply is made possible.

Even in the case where the gate width of the transistors TP1 is made the same as that of the transistors TP2, however, effects similar to those in the case of the first embodiment in which the gate width is changed can be obtained by increasing the number of the transistors TP2 as compared with the number of the transistors TP1.

As for the transistors TP1 and TP2 as well, it is also possible to provide only one transistor TP1 and one transistor TP2 by setting the gate width suitably.

In the first embodiment and the modification, the control line PC1 is divided by a plurality of transfer gates 20 and connected. If the resistor component on the control line PC1 as far as the buffer B2 increases and there are gate capacitances in the power supply switch units U1 and U2, therefore, a sufficient RC delay can be obtained.

Figure 3:
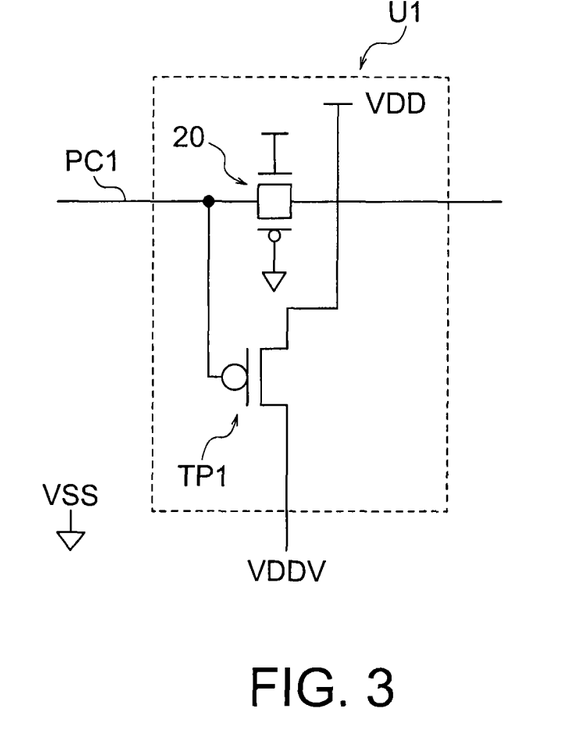
FIG. 3 is a circuit diagram showing a part of the semiconductor integrated circuit device according to the first embodiment.

The transfer gate 20 which divides the control line PC1 has a configuration in which an nMOS transistor and a pMOS transistor are connected in parallel, and both transistors are always in the on-state. A circuit part including the transfer gate 20 and the pMOS transistor TP1 is shown in FIG. 3 and its layout is shown in FIG. 4.

Figure 4:
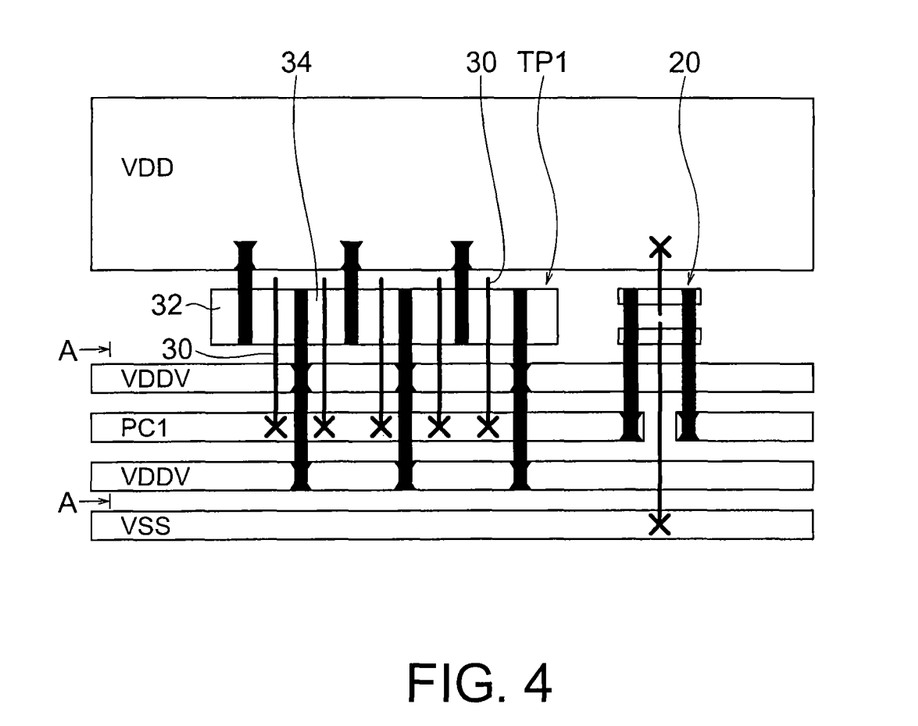
FIG. 4 is a diagram showing a layout of the part of the semiconductor integrated circuit device according to the first embodiment.

As shown in FIG. 4, a thick power supply line VDD is disposed on an upper part. A first virtual power supply line VDDV, a control line PC1, a second virtual power supply line VDDV, and a ground power supply line VSS are disposed in parallel with the power supply line VDD in the cited order. In the layout shown in FIG. 4, two virtual power supply lines are provided. However, only one virtual power supply line may be provided. Furthermore, pMOS transistors TP1 and transfer gates 20 are disposed between the power supply line VDD and the first virtual power supply line VDDV. The pMOS transistors TP1 have a configuration in which a plurality of gates 30 are included and sources 32 or drains 34 are made common. The sources 32 of the transistors TP1 are connected to the power supply line VDD, and the drains 34 of the transistors TP1 are connected to the first and second virtual power supply lines VDDV. In FIG. 4, a mark "x" represents a contact. The gates of the transistors TP1 are connected to the control line PC1. Furthermore, the nMOS transistor in the transfer gate 20 is connected at its gate to the power supply line VDD, and the pMOS transistor in the transfer gate 20 is connected at its gate to the ground power supply line VSS. A source of the nMOS transistor and a drain of the pMOS transistor in the transfer gate 20 are connected in common to a first piece obtained by dividing the control line PC1. A drain of the nMOS transistor and a source of the pMOS transistor in the transfer gate 20 are connected in common to a second piece obtained by dividing the control line PC1. Therefore, the two pieces obtained by dividing the control line PC1 are connected to each other via the transfer gate 20.

By the way, if an nMOS transistor having a low threshold is used as the transfer gate 20, it can convey a signal by itself. Therefore, it is not necessary to provide the pMOS transistor in parallel with the nMOS transistor. Furthermore, even if the nMOS transistor is removed and only the pMOS transistor is left, the transistor TP1 in the power supply switch unit U1 can be turned on, and consequently the nMOS transistor may be removed.

Furthermore, the control line PC1 may be divided in one place or may be divided in a plurality of places. The number of divisions depends upon whether the desired delay time is long or short. In other words, if a long delay time is to be obtained, the division places increase.

FIGS. 5(a) to 5(f) show sections of the layout of the control line PC1 and the virtual power supply line VDDV. For example, FIG. 5(a) shows a section obtained by cutting the layout along a cut line A-A shown in FIG. 4. In other words, FIG. 5(a) shows a configuration in which the control line PC1 is disposed on a substrate 100 to be sandwiched between the first and second virtual power supply lines VDDV in a direction parallel to the substrate 100. Owing to such an arrangement, parasitic capacitances are generated between the control line PC1 and the virtual power supply lines. By the way, the virtual power supply line VDDV on one side shown in FIG. 5(a) may be omitted.

FIG. 5(b) shows a configuration obtained by providing a metal interconnection serving as a virtual power supply line VDDV in a layer underlying the control line PC1 shown in FIG. 5(a). In FIG. 5(b), capacitance is provided downward as well in addition to between the control line PC1 and the left and right virtual power supply lines VDDV. FIG. 5(c) shows a case where metal interconnections serving as virtual power supply lines VDDV are disposed in a layer underlying the control line PC1 and a layer overlying the control line PC1, in addition to the left and right virtual power supply lines VDDV. It is appreciated from FIG. 5(b) and FIG. 5(c) that a virtual power supply line may be provided only in the layer overlying the control line PC1 without a metal interconnection in the layer underlying the control line PC1.

FIG. 5(d) shows a configuration in which virtual power supply lines VDDV are not provided in the lateral direction, but a metal interconnection serving as a virtual power supply line VDDV is provided in a layer underlying the control line PC1. In FIG. 5(d), the disposition relation of the control line PC1 and the virtual power supply line may be reversed.

FIG. 5(e) shows a configuration in which a metal interconnection is not provided in a layer underlying the control line PC1, but a well or a diffusion layer 102 is provided in the substrate 100. This well or diffusion layer 102 has a VDDV potential, and a virtual power supply line VDDV connected to the well or diffusion layer 102 is provided at the side of the control line PC1.

FIG. 5(f) shows a configuration in which metal interconnections serving as virtual power supply lines VDDV are provided in a layer underlying the control line PC1 and in a layer overlying the control line PC1.

In this way, it becomes possible to provide parasitic capacitance between the control line PC1 and the virtual power supply line VDDV by disposing the control line PC1 and the virtual power supply line VDDV, for example, as shown in FIGS. 5(a) to 5(f). As a result, the capacitor becomes unnecessary.

Second Embodiment

Figure 6:
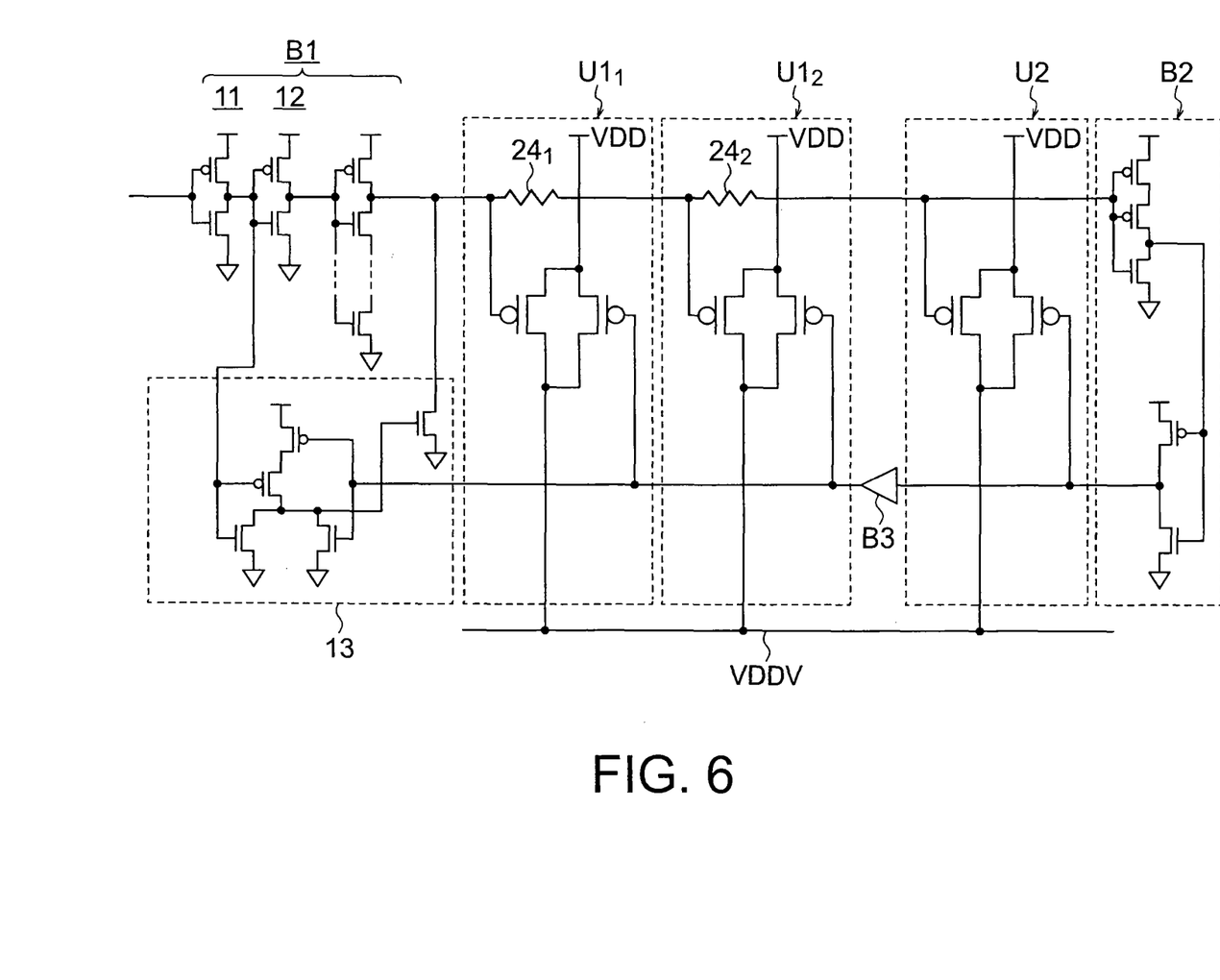
FIG. 6 is a circuit diagram showing a semiconductor integrated circuit device according to a second embodiment.

A semiconductor integrated circuit device according to a second embodiment is shown in FIG. 6. The semiconductor integrated circuit device according to the second embodiment has a configuration obtained by replacing the transfer gates $20_1$ and $20_2$ respectively in the power supply units $UI_1$ and $UI_2$ in the first embodiment shown in FIG. 1 with resistance elements $24_1$ and $24_2$, respectively.

Owing to such a configuration, it becomes possible to increase resistance components between the buffer B1 and the buffer B2. If there is gate capacitance in the power supply switch unit, a sufficient RC delay can be obtained.

By the way, the resistance elements $24_1$ and $24_2$ can be formed of diffusion resistors, poly-resistors, contact resistors, via resistors, or other resistors using hybrid integrated devices.

The control line PC1 may be divided by such resistance elements in one place or in a plurality of places. The number of divisions depends upon whether the desired delay time is long or short.

Figure 5:
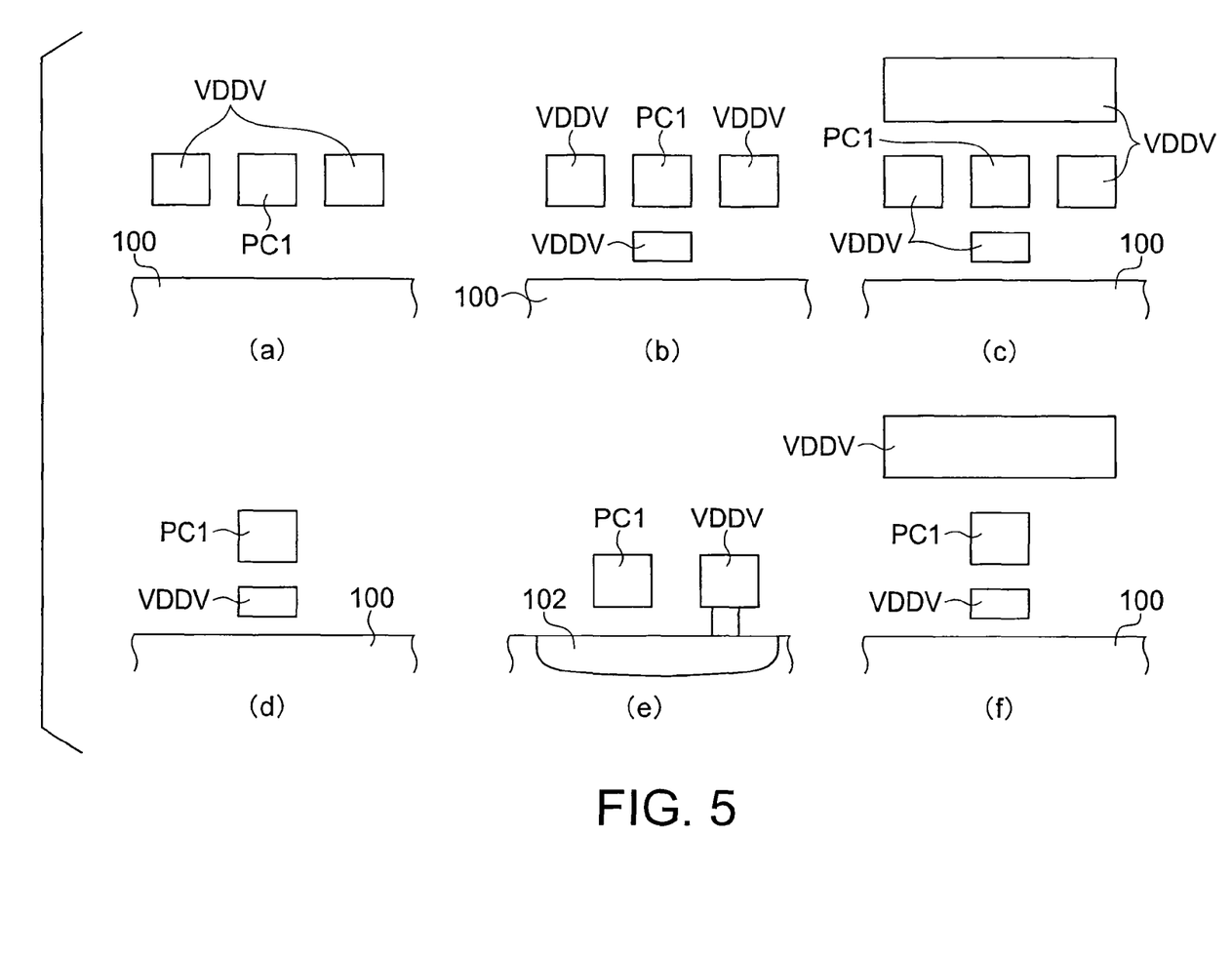
FIGS. 5(a) to 5(f) are diagrams showing examples of a parasitic capacitance between control lines and a virtual power supply line.

Furthermore, the control line PC1 is laid out to have parasitic capacitance between the control line PC1 and the virtual power supply line VDDV in the same way as described with reference to FIGS. 4 to 5(f) in the first embodiment.

In the second embodiment as well, it is possible to suppress the rush current and suppress the increase of the chip area in the same way as the first embodiment.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

The invention claimed is:

1. A semiconductor integrated circuit device comprising:
   a first control line;
   a second control line;
   a first transistor connected at a source thereof to an input power supply line, connected at a drain thereof to an output power supply line, and connected at a gate thereof to the first control line;
   a second transistor connected at a source thereof to the input power supply line, connected at a drain thereof to the output power supply line, and connected at a gate thereof to the second control line;
   a third transistor connected at a source thereof to the input power supply line, connected at a drain thereof to the output power supply line, and connected at a gate thereof to the first control line;
   a fourth transistor connected at a source thereof to the input power supply line, connected at a drain thereof to the output power supply line, and connected at a gate thereof to the second control line;
   a first buffer configured to drive the first control line;
   a second buffer configured to receive a control signal input via the first control line and drive the second control line; and
   a transfer gate disposed between the gate of the first transistor and the gate of the third transistor.

2. The semiconductor integrated circuit device according to claim 1, wherein the transfer gate is connected at a source thereof to the gate of the first transistor, connected at a drain thereof to the gate of the third transistor, and connected at a gate thereof to the input power supply line or a ground power supply line.

3. The semiconductor integrated circuit device according to claim 1, wherein the first control line is arranged in parallel to the input power supply line and the output power supply line.

4. The semiconductor integrated circuit device according to claim 1, wherein
   the output power supply line is disposed at side of the first control line.

5. The semiconductor integrated circuit device according to claim 1, wherein
   the output power supply line is disposed in a layer underlying the first control line.

6. The semiconductor integrated circuit device according to claim 1, wherein
   the output power supply line is disposed in a layer overlying the first control line.

7. A semiconductor integrated circuit device comprising:
   a first control line;
   a second control line;
   a first transistor connected at a source thereof to an input power supply line, connected at a drain thereof to an output power supply line, and connected at a gate thereof to the first control line;
   a second transistor connected at a source thereof to the input power supply line, connected at a drain thereof to the output power supply line, and connected at a gate thereof to the second control line;
   a third transistor connected at a source thereof to the input power supply line, connected at a drain thereof to the output power supply line, and connected at a gate thereof to the first control line;
   a fourth transistor connected at a source thereof to the input power supply line, connected at a drain thereof to the output power supply line, and connected at a gate thereof to the second control line;
   a first buffer configured to drive the first control line;
   a second buffer configured to receive a control signal input via the first control line and drive the second control line; and
   a resistance element including a first terminal connecting to the gate of the first transistor, and a second terminal connected to the gate of the third transistor.

8. The semiconductor integrated circuit device according to claim 7, wherein the first control line is arranged in parallel to the input power supply line and the output power supply line.

9. The semiconductor integrated circuit device according to claim 7, wherein
   the output power supply line is disposed at side of the first control line.

10. The semiconductor integrated circuit device according to claim 7, wherein
    the output power supply line is disposed in a layer underlying the first control line.

11. The semiconductor integrated circuit device according to claim 7, wherein
    the output power supply line is disposed in a layer overlying the first control line.

12. The semiconductor integrated circuit device according to claim 5, wherein the output power supply line is disposed as a metal interconnection.

13. The semiconductor integrated circuit device according to claim 6, wherein the output power supply line is disposed as a metal interconnection.

14. The semiconductor integrated circuit device according to claim 10, wherein the output power supply line is disposed as a metal interconnection.

15. The semiconductor integrated circuit device according to claim 11, wherein the output power supply line is disposed as a metal interconnection.

* * * * *